United States Patent
Chen et al.

(10) Patent No.: US 7,515,457 B2
(45) Date of Patent: Apr. 7, 2009

(54) CURRENT DRIVEN MEMORY CELLS HAVING ENHANCED CURRENT AND ENHANCED CURRENT SYMMETRY

(75) Inventors: Eugene Youjun Chen, Fremont, CA (US); Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 105 days.

(21) Appl. No.: 11/361,267

(22) Filed: Feb. 24, 2006

(65) Prior Publication Data

US 2008/0205121 A1    Aug. 28, 2008

(51) Int. Cl.
*G11C 11/00* (2006.01)

(52) U.S. Cl. ............... 365/158; 365/189.09; 365/189.11
(58) Field of Classification Search ............... 365/158
See application file for complete search history.

(56) References Cited

U.S. PATENT DOCUMENTS

| | | | |
|---|---|---|---|
| 2002/0096721 A1 | 7/2002 | Mogami et al. | |
| 2003/0063518 A1* | 4/2003 | Fong et al. | 365/230.06 |
| 2004/0196091 A1* | 10/2004 | Rostaing et al. | 327/534 |
| 2005/0213412 A1 | 9/2005 | Miki | |
| 2006/0034117 A1* | 2/2006 | Jeong et al. | 365/158 |
| 2006/0114739 A1* | 6/2006 | Worley et al. | 365/230.06 |
| 2006/0133136 A1* | 6/2006 | Iwata | 365/158 |
| 2006/0164137 A1* | 7/2006 | Van De Beek et al. | 327/156 |

OTHER PUBLICATIONS

Kaushik Roy, et al., *Leakage Current Mechanisms and Leakage Reduction Techniques in Deep-Submicrometer CMOS Circuits*, Proceedings of the IEEE, vol. 91, No. 2, Feb. 2003.

John DeBrosse, et al., *A High-Speed 128-kb MRAM Core for Future Universal Memory Applications*, IEEE Journal of Solid-State Circuits, vol. 29, No. 4, Apr. 2004.

Eugene Y. Chen, et al., *Current Driven Switching of Magnetic Storage Cells Utilizing Spin Transfer and Magnetic Memories Using Such Cells*, U.S. Appl. No. 11/217,524.

Eugene Y. Chen, et al., *Current Driven Switching of Magnetic Storage Cells Utilizing Spin Transfer and Magnetic Memories Using Such Cells*, U.S. Appl. No. 11/217,258.

PCT International Search Report and Written Opinion of the International Searching Authority, issued Oct. 1, 2008, application No. PCT/US07/04662.

\* cited by examiner

*Primary Examiner*—Huan Hoang
*Assistant Examiner*—Anthan T Tran
(74) *Attorney, Agent, or Firm*—Strategic Patent Group, P.C.

(57) ABSTRACT

A method and system for providing and using a magnetic memory is described. The method and system include providing a plurality of magnetic storage cells. Each magnetic storage cell includes a magnetic element and a selection device coupled with the magnetic element. The magnetic element is programmed by write currents driven through the magnetic element in a first or second direction. In one aspect, the method and system include providing a voltage supply and a voltage pump coupled with the magnetic storage cells and the voltage supply. The voltage supply provides a supply voltage. The voltage pump provides to the selection device a bias voltage having a magnitude greater than the supply voltage. Another aspect includes providing a silicon on oxide transistor as the selection device. Another aspect includes providing to the body of the transistor a body bias voltage that is a first voltage when the transistor is off and a second voltage when the transistor is on.

18 Claims, 8 Drawing Sheets

CURRENT DRIVEN MEMORY CELLS HAVING ENHANCED CURRENT AND ENHANCED CURRENT SYMMETRY

FIELD OF THE INVENTION

The present invention relates to magnetic memory systems, and more particularly to a method and system for providing a memory, magnetic storage cells and selection devices having enhanced current and enhanced current symmetry.

BACKGROUND OF THE INVENTION

FIGS. 1 and 2 depict a small portion of a conventional magnetic random access memory (magnetic RAM) 1 that utilizes spin transfer based switching. The conventional magnetic RAM 1 includes a conventional magnetic storage cell 10 including a magnetic element 12 and a selection device 14. The selection device 14 is typically a transistor, such as a CMOS transistor, and has a gate 15. Also depicted are a word line 16, a bit line 18, and source line 20. The word line 16 is typically oriented perpendicular to the bit line 18. The source line 20 is typically either parallel or perpendicular to the bit line 18, depending on specific architecture used for the magnetic RAM 1.

The conventional magnetic element 12 is configured to be changeable between high and low resistance states by driving a current through the conventional magnetic element 12. The current is spin polarized when passing through the magnetic element 12 and changes the state of the magnetic element 12 by the spin transfer effect. For example, the magnetic element 12 may be a magnetic tunnel junction (MTJ) configured to be written using the spin transfer effect. Typically, this is achieved by ensuring that the magnetic element 12 has, for example, a sufficiently small cross-sectional area as well as other features desirable for switching using the spin transfer effect. When the current density is sufficiently large, the current carriers driven through the magnetic element 12 may impart sufficient torque to change the state of the magnetic element 12. When the write current is driven in one direction, the state may be changed from a low resistance state to a high resistance state. When the write current is driven in the opposite direction, the state may be changed from a high resistance state to a low resistance state.

FIG. 1 depicts the conventional magnetic storage cell 10 being written to a first state by the write current, $I_{W1}$, being driven in a first direction. Thus, in FIG. 1 the bit line 18 and the word line 16 are activated. The selection device 14 is turned on. The first write current is driven from the bit line 18 to the source line 20. Consequently, a high voltage, $V_{write}$, is coupled to the bit line 18 while the source line 20 is coupled to ground. The first write current thus flows through the magnetic element 12. FIG. 2 depicts the conventional magnetic element 10 being written to a second state by a second write current, $I_{W2}$, being driven in the opposite direction. The bit line 18 and the word line 16 are still activated and the selection device 14 turned on. The high voltage, $V_{write}$, is coupled to the source line 20 while the bit line 18 is coupled to ground. Thus, the second write current, $I_{W2}$, flows through the conventional magnetic element 12.

For a read operation, the bit line 18 and the word line 16 are activated. Consequently, the selection device 14 is turned on. A read current is driven through the magnetic element 12. The read current is typically less than either the first current $I_{W1}$ or the second write current $I_{W2}$.

The conventional magnetic RAM 1 utilizes a write current driven through the magnetic element 12 in order to program data to the conventional magnetic storage cell 10. Thus, the conventional magnetic RAM 1 uses a more localized phenomenon in programming the conventional magnetic element 12. Unlike a conventional MRAM that switches its state by applying magnetic fields, the conventional magnetic RAM 1 does not suffer from a half select write disturb problem. Moreover, for higher density memories, and smaller individual magnetic elements 12, a lower current corresponds to the same current density as a larger magnetic element. Thus, the current required to write to the conventional magnetic RAM 1 decreases with decreasing size, which is desirable. This trend is distinct from a conventional MRAM that switches its state by applying magnetic fields, which requires a significantly higher write current at lower sizes. For example, for a conventional magnetic element 12 having a size less than approximately two hundred nanometers, the conventional magnetic RAM 1 utilizes a lower write current than the write current used to generate a write field for a conventional MRAM that switches its state by applying magnetic fields.

Although the conventional magnetic RAM 1 generally utilizes a lower current and a more localized programming scheme, one of ordinary skill in the art will readily recognize that the use of the conventional magnetic RAM 1 in higher density memory applications may be limited by various factors. For example, the size of a conventional storage cell 10 may primarily be determined by the write current used to switch the conventional magnetic element 12. Advanced photolithography techniques typically result in a transistor having a gate 15 width of less than 0.2 to 0.3 microns. A typical transistor outputs approximately four hundred to five hundred micro-Amperes per micron of gate width. Consequently, the selection device 14 typically produces current of less than one hundred to one hundred fifty micro-Amperes. The conventional magnetic storage cell 10 may require two to ten times that current in order to switch the state of the conventional magnetic element 12. In order to support such a large current, the selection device 14 is made significantly larger than the 0.2-0.3 microns capable of being produced. Consequently, the size of the conventional storage cell 10 is increased.

The situation may be further complicated in an actual magnetic RAM 1, which typically includes numerous storage cells 10 in an array. In such an array, a large number of cells are typically connected in parallel to each bit line 18. For example, the conventional magnetic RAM may connect thousands of conventional storage cells 10 to each bit line and may include a large number of bit lines. During a single read or write operation, only a subset of the cells on a bit line 18 is activated. For example, a single storage cell 10 along a bit line 18 may be activated. The remaining cells (not shown) are presumed to be off. However, a typical selection device 14 has a small leakage current in the off state. A typical transistor has a drain-to-source current on/off ratio of approximately one thousand to one million. Consequently, one thousand cells 10 in the off state may collectively have a leakage current that is comparable to a transistor 14 in the on state for the single storage cell 10 that is on. This leakage current may, therefore, significantly reduce the current available for reading of and writing to the desired storage cell 10 and increase power consumption. Moreover, the critical dimension, f, of RAM decreases, the magnitude of the available supply voltage formed using conventional CMOS is decreased. Consequently, for smaller, denser memories, the problem of leakage current may be exacerbated.

One remedy for the leakage is to increase the threshold voltage of the selection device 14. However, such a remedy results in a in a lower available source-drain current. Furthermore, an increase in the threshold voltage is typically accomplished by making the conventional storage device 14 larger. As a result, the conventional storage cell 10 is again made larger, which is undesirable.

Moreover, when the conventional magnetic element 12 is coupled with a transistor, other issues arise. The drain-source current is typically smaller for the combination of the conventional magnetic element 12 and the transistor 14 than for the transistor 14 by itself. A voltage, for example a supply voltage, applied to the combination of the conventional magnetic element 12 and the transistor 14 is split between the conventional magnetic element 12 and the transistor 14. Stated differently, a portion of the voltage drop occurs across the transistor 14, while a remaining portion of the voltage drop occurs across the conventional magnetic element 12. As a result, a smaller voltage is available to provide a voltage drop across the transistor 14. The transistor drain-source current is thereby reduced.

Furthermore, the source-drain current may be asymmetric for the combination of the conventional magnetic element 12 and the transistor 14. The transistor source-drain current differs depending upon whether the conventional magnetic element 12 is connected to the drain side or to the source side of the transistor 14. This difference may range from ten to fifty percent. For example, application of a supply voltage to the bit line 18 and application of the same voltage to the source line 20 may result in different currents through the transistor 14. Thus, the source-drain current for a write current driven in one direction, as in FIG. 1, may be different than for a current driven in the opposite direction, as in FIG. 2. As a result, writing to the conventional magnetic element 10 may be asymmetric. Such an asymmetry is undesirable.

In addition, semiconductor memories have memory cells having areas in the range of 4 f$^2$ to 12 f$^2$, where f is the critical photolithographic dimension. It would be desirable to produce magnetic RAM having such size ranges in order to better compete with other types of nonvolatile storage. However, the above difficulties in the size of the conventional storage cell 10, the write currents required, the sizes of the selection devices 14, the problems due to leakage current, and issues with the connection between elements of a conventional storage cell 10 may make it difficult to use the magnetic RAM 1 using current for writing to the conventional magnetic element 12 as an alternative to other types of memory.

Accordingly, what is desired is a method and system for providing and utilizing memory cells that may employ spin transfer based switching, which utilize a smaller write current, which provide for a more symmetric write current, and may be suitable for a higher density magnetic memory. The present invention addresses such a need.

BRIEF SUMMARY OF THE INVENTION

The present invention provides a method and system for providing and using magnetic memory. The method and system comprise providing a plurality of magnetic storage cells. Each of the plurality of magnetic storage cells includes a magnetic element and a selection device coupled with the magnetic element. The magnetic element is programmed by a first write current driven through the magnetic element in a first direction and a second write current driven through the magnetic element in a second direction. In one aspect, the method and system comprise providing a voltage supply and a voltage pump coupled with plurality of magnetic storage cells and the voltage supply. The voltage supply provides a supply voltage. The voltage pump provides a bias voltage to the selection device. The bias voltage is based on the supply voltage and has a magnitude greater than the supply voltage. In another aspect the method and system comprise providing a silicon on oxide transistor as the selection device. In another aspect, the method and system comprise providing a body bias voltage to the body of the transistor. The body bias voltage is a first voltage when the transistor is off and a voltage when the transistor is on.

According to the method and system disclosed herein, the present invention provides a mechanism for programming and reading a magnetic memory that may provide an enhanced write current as well as a more symmetric write current.

DETAILED DESCRIPTION OF THE INVENTION

Figure 1:
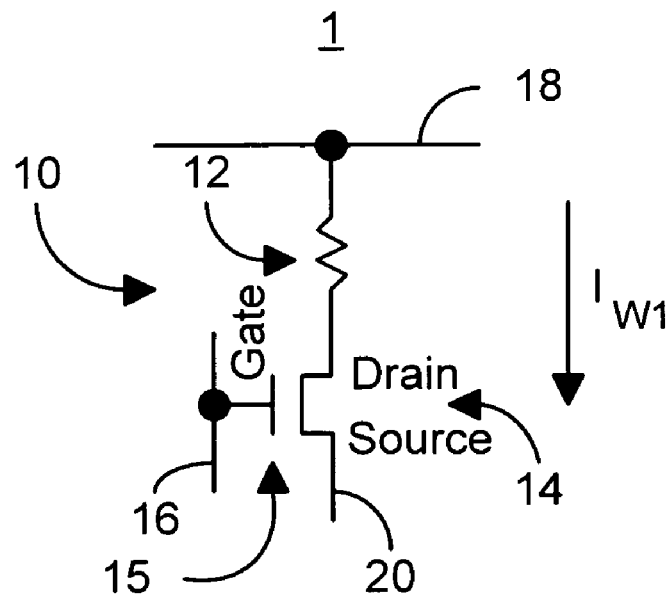
FIG. 1 is a diagram of a portion of a conventional magnetic RAM memory when a first state is written to the magnetic storage cell.
Figure 2:
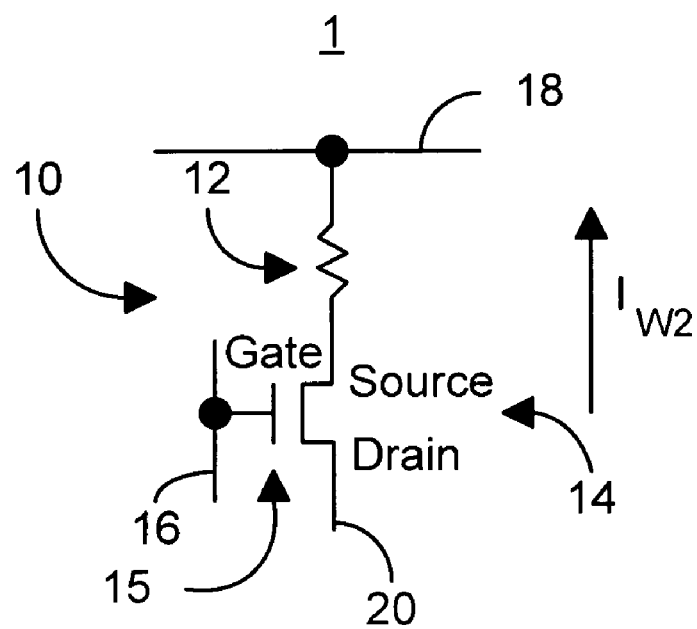
FIG. 2 is a diagram of a portion of a conventional magnetic RAM memory when a second state is written to the magnetic storage cell.

The present invention relates to a magnetic memory. The following description is presented to enable one of ordinary skill in the art to make and use the invention and is provided in the context of a patent application and its requirements.

Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing and using magnetic memory. The method and system comprise providing a plurality of magnetic storage cells. Each of the plurality of magnetic storage cells includes a magnetic element and a selection device coupled with the magnetic element. The magnetic element is programmed by a first write current driven through the magnetic element in a first direction and a second write current driven through the magnetic element in a second direction. In one aspect, the method and system comprise providing a voltage supply and a voltage pump coupled with plurality of magnetic storage cells and the voltage supply. The voltage supply provides a supply voltage. The voltage pump provides a bias voltage to the selection device. The bias voltage is based on the supply voltage and has a magnitude greater than the supply voltage. In another aspect the method and system comprise providing a silicon on oxide transistor as the selection device. In another aspect, the method and system comprise providing a body bias voltage to the body of the transistor. The body bias voltage is a first voltage when the transistor is off and a second voltage when the transistor is on.

The present invention is described in the context of particular magnetic memories having certain components, such magnetic storage cells having magnetic elements and particular components. One of ordinary skill in the art will readily recognize that the present invention is consistent with the use of magnetic memories having other and/or additional components consistent with the present invention. The method and system in accordance with the present invention are also described in the context of reading from, writing to, or providing a single magnetic storage cell. However, one of ordinary skill in the art will readily recognize that the method and system can be extended to read from, write to, and/or provide multiple magnetic storage cells substantially in parallel. The present invention is described in the context of certain memories. However, one of ordinary skill in the art will readily recognize that the present invention is compatible with memories and other devices not inconsistent with the present invention. The present invention is also described in the context of particular methods. One of ordinary skill in the art will, however, readily recognize that other methods having different and/or additional steps consistent with the present invention may be used. Moreover, the present invention is described in the context of spin-transfer based magnetic memory cells. However, one of ordinary skill in the art will recognize that the mechanisms herein may be applied to other resistive memories, such as resistive memories relying on a phase change to store data.

Figure 3A:
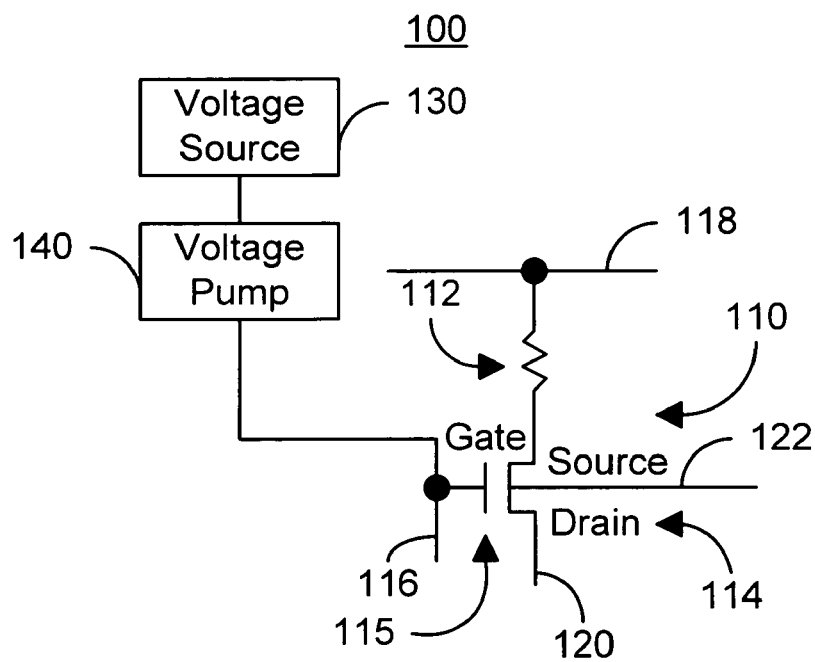
FIG. 3A is a diagram of one embodiment of a portion of a magnetic memory in accordance with the present invention utilizing spin transfer in switching and having enhanced current through the selection device.
Figure 3B:
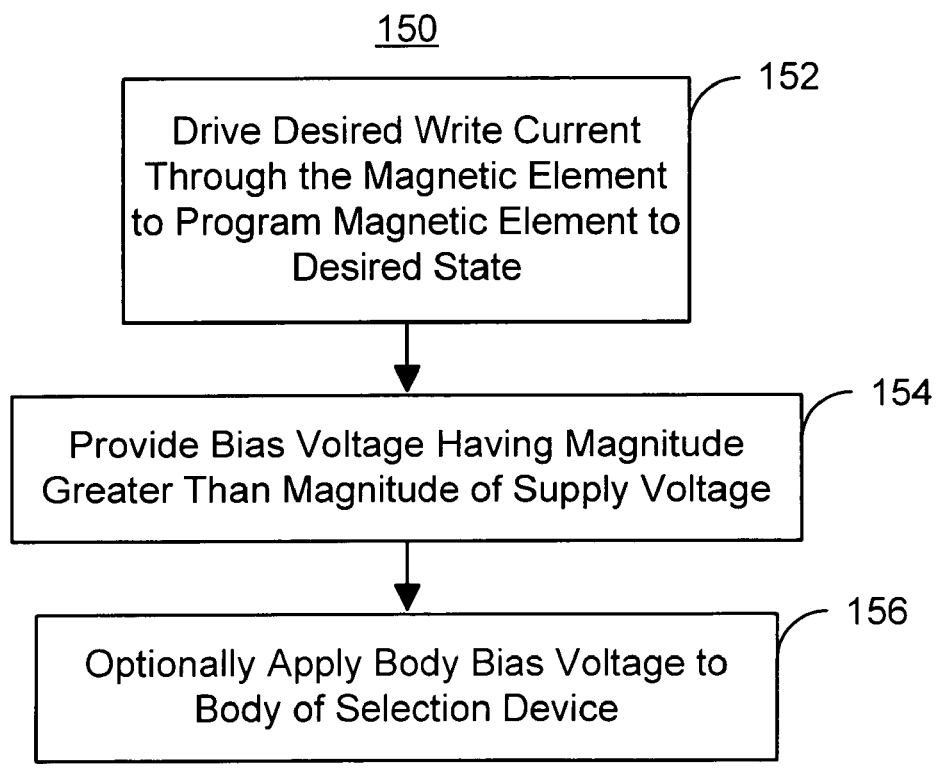
FIG. 3B is a flow chart depicting one embodiment of a method in accordance with the present invention for utilizing the magnetic memory having enhanced current through the selection device.

To more particularly describe the method and system in accordance with the present invention, refer to FIGS. 3A and 3B. FIG. 3A is a diagram of one embodiment of a portion of a magnetic memory 100 in accordance with the present invention utilizing spin transfer in switching and having enhanced current through the selection device. FIG. 3B is a flow chart depicting one embodiment of a method 150 in accordance with the present invention for utilizing the magnetic memory 100.

Referring back to FIG. 3A the magnetic memory 100 includes a magnetic memory cell 110 including a magnetic element 112 capable of being programmed using spin transfer and a selection device 114. The selection device 114 is preferably a selection transistor having a gate 115, as well as a source and a drain. The magnetic element 112 is also read by driving a read current through the magnetic element 112. Thus, the magnetic element 112 may exhibit giant magnetoresistance. The magnetic memory 100 also includes lines 116, 118, and 120. The lines 116, 118, and 120 are referred to herein as a word line 116, a bit line 118, and a source line 120, respectively. The magnetic memory 100 also includes a voltage source 130 and voltage pump 140 that is preferably coupled with the word line 116 and, therefore, the gate 115 of the selection transistor 114.

The magnetic element 112 is preferably programmed to a first state using a write current, $I_1$, passed in a first direction and programmed to a second state using a second write current, $I_2$, in a second direction. The magnetic memory 100 is preferably, therefore, a magnetic RAM. The magnetic element 112 might include a number of layers (not shown), but preferably includes at least a magnetic pinned layer (not shown), a nonmagnetic spacer layer (not shown), and a magnetic free layer (not shown) having a magnetization that can be changed using the write currents. The nonmagnetic spacer layer is preferably a tunneling barrier layer. However, in another embodiment, the nonmagnetic spacer layer might be another layer including but not limited to be a conductive or current-confined layer. In addition, in another embodiment, the magnetic element 112 may include different and/or additional components consistent with the present invention. The selection device 114 is preferably a selection transistor 114, for example a CMOS transistor. In one embodiment, the selection transistor 114 may be a silicon-on-oxide (SOI) transistor. In one embodiment, the selection transistor 114 may also have an optional bias line 122 coupled to the body of the transistor 114. However, in another embodiment, the bias line 122 may be omitted.

The voltage source 130 provides a voltage that is to be used in biasing the gate 115 of the selection transistor 114. In one embodiment, this voltage is one volt. The voltage pump 140 is used to increase the voltage that may be provided to bias the selection transistor 114 to be greater than the voltage provided by the voltage source 130. For example, in one embodiment, the voltage pump 140 increase the bias voltage provided to the gate 115 by one-half volt. Thus, the voltage source 130 may provide a supply voltage of one volt, but the voltage provided to bias the gate 115 of the selection transistor 114 may be 1.5 volts. The voltage source 130 and voltage pump 140 may be shared by other cells (not shown). However, in an alternate embodiment, the voltage source 130 may provide a higher voltage so that the voltage pump 140 might be omitted. Because a higher voltage may be used to bias the gate 115 of the selection transistor 114, the selection transistor 114 is capable of handling the higher voltage without breaking down. This may be accomplished by using a thicker gate oxide and/or an insulator for the gate oxide having a higher dielectric constant. For example, in one embodiment, the gate oxide for the selection transistor 114 is at least 0.8 nm through 5 nm in thickness, and preferably greater than 1.2 nm thick. In one embodiment, the insulator may have a dielectric constant of at greater than 3.9. In a preferred embodiment, the insulator has a dielectric constant of 6-14 and/or may be made of materials such as hafnium oxide ($HfO_2$), zirconium dioxide ($ZrO_2$) and/or titanium oxide ($TiO_2$).

FIG. 3B depicts the method 150 for programming the magnetic memory 100. The desired write current is driven through the magnetic element, via step 152. Thus, the first current, $I_1$, or the second current, $I_2$, is driven through the magnetic element 112 in each of one or more storage cells 110 in step 152. In addition, a bias voltage is provided to the selection device 114 while the first current or the second current is driven through the magnetic element 112, via step 154. The bias voltage provided in step 154 has a magnitude that is greater than the supply voltage. Step 154 is preferably performed using a combination of the voltage source 130 to provide a supply voltage and the voltage pump 140. However, another system may be used to provide the bias voltage. For example, a voltage source 130 having a voltage of greater than 1.2 volts (for example 1.2 v for 90 nm, 1.0 v for 65 nm, maybe 0.5 v for 32 nm node) may be used. In other embodiments, a higher voltage which is at least one point five and/or between one point five and ten volts may be used to provide the higher bias voltage in step 154. Thus, the bias voltage provided to the gate 115 in step 154 may have a magnitude greater than the supply voltage. A body bias may also optionally be applied to the body of the selection device 114, via step 156. Consequently, leakage current from the selection device 114 may also be reduced by applying a different off-state body bias voltage.

Figure 4:
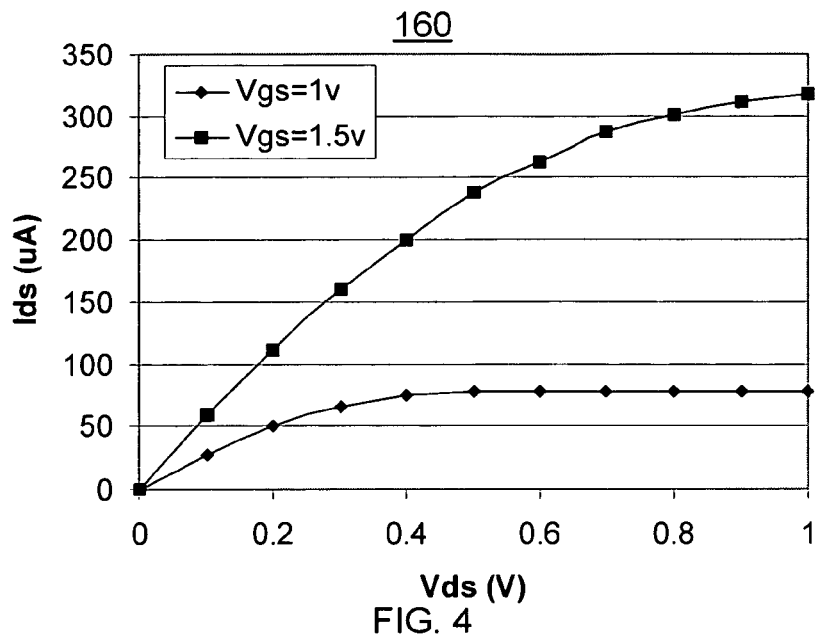
FIG. 4 is a graph depicting transistor drain to source current versus transistor drain to source voltage for different gate to source voltages.

FIG. 4 is a graph 160 depicting transistor drain to source current versus transistor drain to source voltage for different gate to source voltages. As can be seen in FIG. 4, the source-drain current supported by the selection transistor 114 is significantly greater for a bias voltage of 1.5 volts than for one volt. In some instances, the transistor drain to source current (Ids) is increased by four to five times, from about seventy µA to three hundred twenty µA.

Figure 5A:
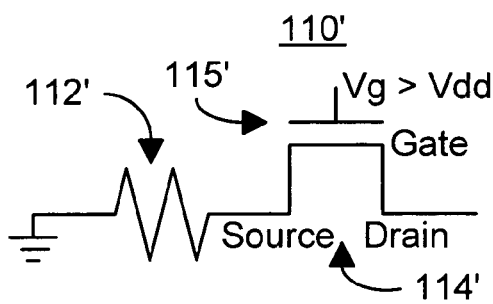
FIGS. 5A-5C depict bias voltages produced by a voltage pump as applied for a storage cell when the magnetic element is coupled to the source side of the selection transistor.
Figure 5B:
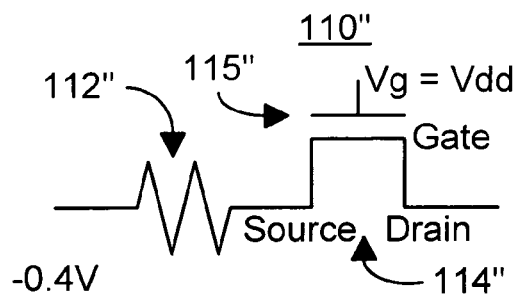
Figure 5C:
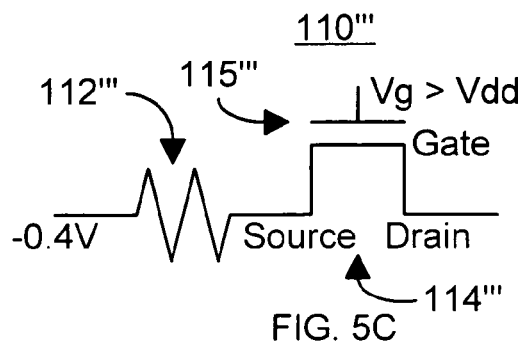

Using the magnetic memory 100 and method 150, current through the magnetic element 112 can be increased without increasing the size of the selection transistor 114. For example, FIGS. 5A-5C depict bias voltages produced by a voltage pump 140 as applied to storage cells 110', 110", and 110'". FIG. 5A depicts a storage cell 110' including magnetic element 112' and selection transistor 114' having gate 115'. In the embodiment shown, the magnetic element 112' is coupled with the source side of the selection transistor 114'. A bias voltage, Vg, that is greater than the supply voltage, Vdd, is applied to the gate 115' of the selection device. Such a voltage may be applied using the voltage pump 140. In addition, the magnetic element 112' is coupled to ground. Consequently, a higher write current can be provided through the magnetic element 112' for the same size selection transistor 114'.

FIG. 5B depicts a storage cell 110" including magnetic element 112" and selection transistor 114" having gate 115"'. In the embodiment shown, the magnetic element 112" is coupled with the source side of the selection transistor 114". A bias voltage that is equal to the supply voltage, Vdd, is applied to the gate 115" of the selection device. However, the magnetic element 112" is coupled to a negative voltage. The decrease in the voltage coupled to the magnetic element 112" has substantially the same effect as increasing the bias voltage applied to the gate 115" above the source voltage of Vdd. Consequently, a higher write current can be provided through the magnetic element 112" for the same size selection transistor 114".

FIG. 5C depicts a storage cell 110'" including magnetic element 112'" and selection transistor 114'" having gate 115'". In the embodiment shown, the magnetic element 112'" is coupled with the source side of the selection transistor 114'". A bias voltage, Vg, that is greater than the supply voltage, Vdd, is applied to the gate 115'" of the selection device. Such a voltage may be applied using the voltage pump 140. Moreover, the magnetic element 112'" is coupled to a negative voltage. Such a negative voltage might be achieved using a charge pump (described below) as the voltage pump in order to produce a negative voltage. Consequently, an even higher write current can be provided through the magnetic element 112'" for the same size selection transistor 114'".

Thus, using the magnetic memory 100 and method 150, a higher bias voltage may be applied to the gate of the selection transistor 114, 114', 114", and 114'". As a result, the transistor 114, 114', 114", and 114'" can support a higher source-drain current. Thus, a smaller transistor 114, 114', 114", and 114'" can be used to provide the write current to the magnetic element 112, 112', 112", and 112'". Consequently, the magnetic memory 100 may have a higher density.

Figure 6:
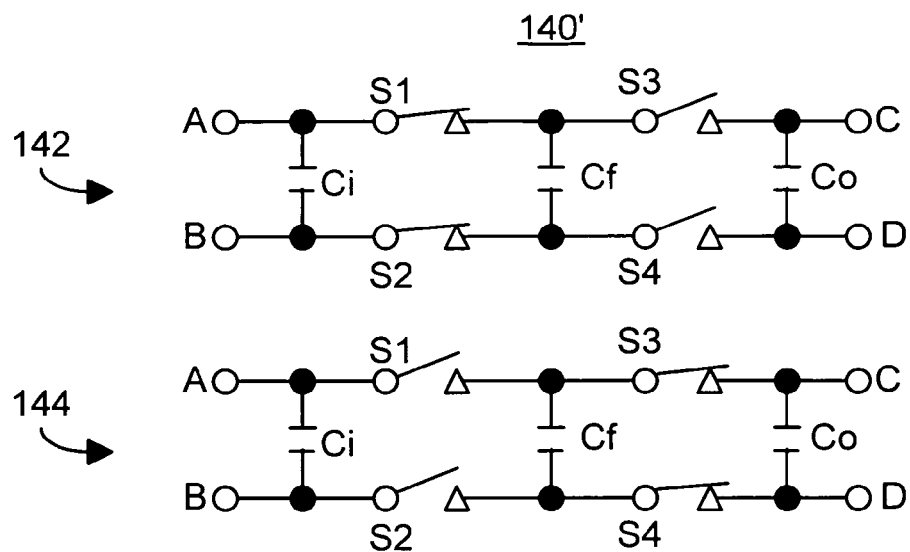
FIG. 6 depicts one embodiment of a charge pump used as a voltage pump in a magnetic memory in accordance with the present invention.

In order to provide the magnetic memory 100, bias configurations of cells 110', 110", and 110'" and/or perform the method 150, a charge pump may be used. FIG. 6 depicts the operation of one embodiment of a charge pump 140' used as a voltage pump in a magnetic memory in accordance with the present invention. The charge pump 140' may be used as the voltage pump 140 in the magnetic memory 100. A charge pump, such as the charge pump 140' utilizes capacitor(s) for storing and transferring energy. Charge pumps typically utilizes one of two basic topologies, doubler and inverter topologies, both of which are characterized by two steps of energy transfer. The charge pump 140' characterizes the energy transfer used in either topology. The charge pump 140' includes capacitors Ci, Cf and Co and switches S1, S2, S3, and S4. FIG. 6 thus depicts the charge pump 140' in during each of two steps used in transferring energy. Thus, the charge pump 140' is shown in a first step 142 and a second step 144. The first step 142 includes uses capacitors Ci, Cf, and Co and switches S1, S2, S3, and S4 in the configuration shown in FIG. 6. The second step 144 includes capacitors Ci, Cf, and Co and switches S1, S2, S3, and S4 in the configuration shown in FIG. 6. In a preferred embodiment, the node D is coupled to the node A. However, for clarity, this connection is not shown.

In a preferred embodiment, the switches S1, S2, S3, and S4 have a low series resistance. In each step 142 and 144 the input capacitor Ci allows for low impedance from the local source used. Thus, the local source may be able to furnish high levels of transient current. In the memory 100, the local source may be the voltage source 130. However, another source, such as a current source, might be used. The capacitor Ci is preferably coupled very near the converter to reduce or avoid voltage drops due to parasitic inductance. Also to avoid the effect of parasitic inductance, Cf and Co are preferably connected very closely to the other components.

The first step 142 stores energy in the capacitors Ci and Cf. When switches S1 and S2 are closed and switches S3 and S4 are open, the capacitor Cf connects directly across the input voltage. The input voltage is the voltage at terminal A (VA) minus the voltage at terminal B (VB). In a preferred embodiment, this is substantially the supply voltage from the voltage source 130. Charge transfers between Ci and Cf until their voltages become equal in value and polarity. Because S1 and S2 are not ideal switches, the bulk of this charge transfer requires a time interval (or finite amount of time) to complete. After this time interval, and provided the input source (e.g. the voltage source 130) has very low source impedance, the voltage acquired by $C1f$ is substantially the same as the input voltage VA–VB.

The second step transfers energy to the output capacitor Co. During the second step 144, switches S1 and S2 are open, while switches S3 and S4 are closed. In a preferred embodiment, a delay is introduced between the two steps to avoid even a brief connection between the left and right parts of the converter. When switches S3 and S4 close, Cf exchanges charge with the output capacitor Co until these capacitor voltages reach the same value. The duration of the exchange depends on the series resistance of the switches S3 and S4. After the switches S3 and S4 are closed, charge transfers from Cf to Co, provided the output nodes are connected to a normal load (rather than to a generator). Thus, Ci transfers a finite amount of charge to Cf, and then Cf connects to Co. If the first step 142 and then the second step 144 are repeated a sufficient number of times (and if the output is not short-circuited), the voltage across Co approaches that across Ci. The differential voltages across input nodes A and B and output nodes C and D are equalized.

Using the charge pump 140', voltage generators with high-side drivers and a number of other applications, may be achieved. For example, an inverter may be obtained by connecting node C to node B, which usually becomes the ground reference. VA−VB=VC−VD, so if VB=VC=ground, then VD=−VA. The doubler is obtained by connecting node D to node A. VC−VA=VA−VB, so VC−VB=2(VA−VB). If VB equals ground, then VC=2VA. Therefore, supply voltages of −Vdd and 2Vdd can be obtained through the use of charge pumps. To obtain supply voltages between ground (zero Volt) and −Vdd, or voltages between ground (zero Volt) and 2Vdd, a voltage splitter can be used to obtain the desired supply voltage values.

Using the charge pump 140' for the voltage pump 140, a number of different voltages can be provided to bias the gate 115 of the selection transistor 114. In a preferred embodiment, the magnitude of such a bias voltage is greater than the supply voltage of the voltage source 130. Consequently, as discussed above, a higher current can be supported by the selection transistor 114.

Figure 7:
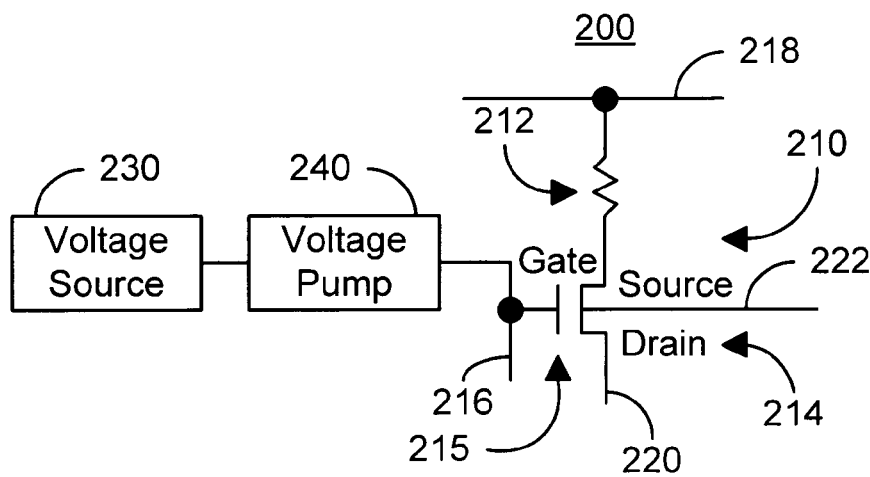
FIG. 7 is a diagram of another embodiment of a portion of a magnetic memory in accordance with the present invention utilizing spin transfer in switching and utilizing a silicon on oxide (SOI) transistor as a selection device.

FIG. 7 is a diagram of another embodiment of a portion of a magnetic memory 200 in accordance with the present invention utilizing spin transfer in switching and utilizing a silicon on oxide (SOI) transistor as a selection device. The magnetic memory 200 includes a magnetic memory cell 210 including a magnetic element 212 capable of being programmed using spin transfer and a selection device 214. The selection device 214 is preferably a CMOS transistor having a gate 215, as well as a source and a drain. The selection device 214 is also a SOI transistor. The magnetic element 212 is read by driving a read current through the magnetic element 212. Thus, the magnetic element 212 may exhibit giant magnetoresistance. The magnetic memory 200 also includes lines 216, 218, and 220. The lines 216, 218, and 220 are referred to herein as a word line 216, a bit line 218, and a source line 220, respectively. The magnetic memory 200 may optionally include a voltage pump 240 that is preferably coupled with the word line 216 and, therefore, the gate 215 of the selection transistor 214. The magnetic memory 200 may optionally include a line 222 that may be used to bias the body of the selection transistor 214. However, in another embodiment, the bias line 222 may be omitted.

The magnetic element 212 is preferably programmed to a first state using a write current, $I_1$, passed in a first direction and programmed to a second state using a second write current, $I_2$, in a second direction. The magnetic memory 200 is preferably, therefore, a magnetic RAM. The magnetic element 212 might include a number of layers (not shown), but preferably includes at least a magnetic pinned layer (not shown), a nonmagnetic spacer layer (not shown), and a magnetic free layer (not shown) having a magnetization that can be changed using the write currents. The nonmagnetic spacer layer is preferably a tunneling barrier layer. However, in another embodiment, the nonmagnetic spacer layer might be another layer including but not limited to be a conductive or current-confined layer. In addition, in another embodiment, the magnetic element 212 may include different and/or additional components consistent with the present invention.

The voltage source 230 provides a voltage that is to be used in biasing the gate 215 of the selection transistor 214. In one embodiment, this voltage is one volt. The voltage pump 240 is used to increase the voltage that may be provided to bias the selection transistor 214 to be greater than the voltage provided by the voltage source 230. For example, in one embodiment, the voltage pump 240 increase the bias voltage provided to the gate 215 by one-half volt. Thus, the voltage source 230 may provide a supply voltage of one volt, but the voltage provided to bias the gate 215 of the selection transistor 214 may be 1.5 volts. Thus, the memory 200 may be analogous to the memory 100 and provide similar advantages. The voltage source 230 and voltage pump 240 may be shared by other magnetic memories connected on the same word line 216 (not shown).

Figure 8:
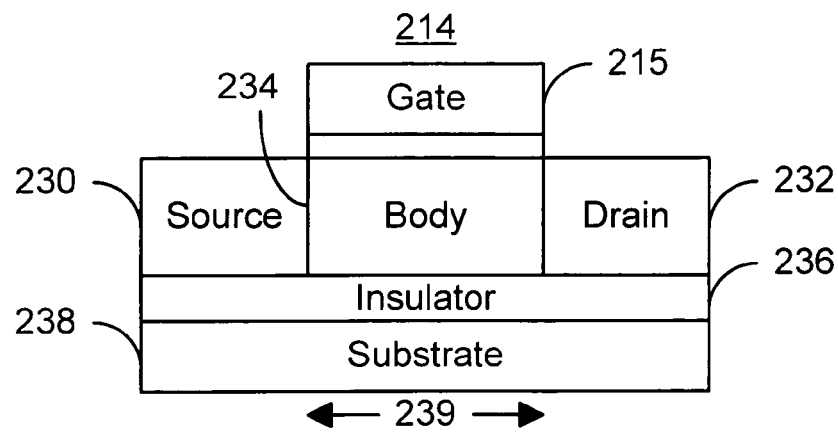
FIG. 8 is a diagram of one embodiment of a SOI transistor.

FIG. 8 is a diagram of one embodiment of the SOI transistor 214. The SOI transistor 214 includes the gate 215 a source 230, a drain 232, a body 234 and is formed on an oxide film 236 formed on a substrate 238. In a conventional CMOS transistor, the oxide film 236 may be omitted. Because the transistor 214 is formed on the insulating layer 236, the body 234 of the transistor 214 is electrically isolated from the substrate 238. Therefore, the body 234 of the transistor 214 may be dynamically biased. Consequently, a high on-state current and very low leakage current during off-state may be achieved. This is true of both NMOS and PMOS transistors. However, for simplicity, only the NMOS case is discussed below to illustrate the mechanisms for dynamic biasing technique. The SOI selection transistor 214 may be fabricated with a channel 239 having a short channel length. A short channel length allows for a high on state current and high leakage current without transistor body bias. Therefore, this size of the transistor 214 is small due to its short channel length. During on-state, the body 234 may be biased set either at ground voltage or a negative voltage to allow for a higher current through the transistor 214. During off-state, the body 234 may be biased using a positive voltage. Consequently, the effective threshold voltage is increased and the leakage current reduced. The storage cell 210 thus has less of an effect on other storage cells (not shown) when the storage cell 210 is unselected. Consequently, a smaller transistor with high on-state current and low off-state leakage current is obtained for use in the magnetic memory 200. Consequently, in addition to the benefits of a high write current without increased transistor size provided by the magnetic memory 100, the magnetic memory 200 may also allow for the size of the transistor 214 to be reduced. Consequently, a higher write current and a higher density magnetic memory 200 may be achieved.

Figure 9A:
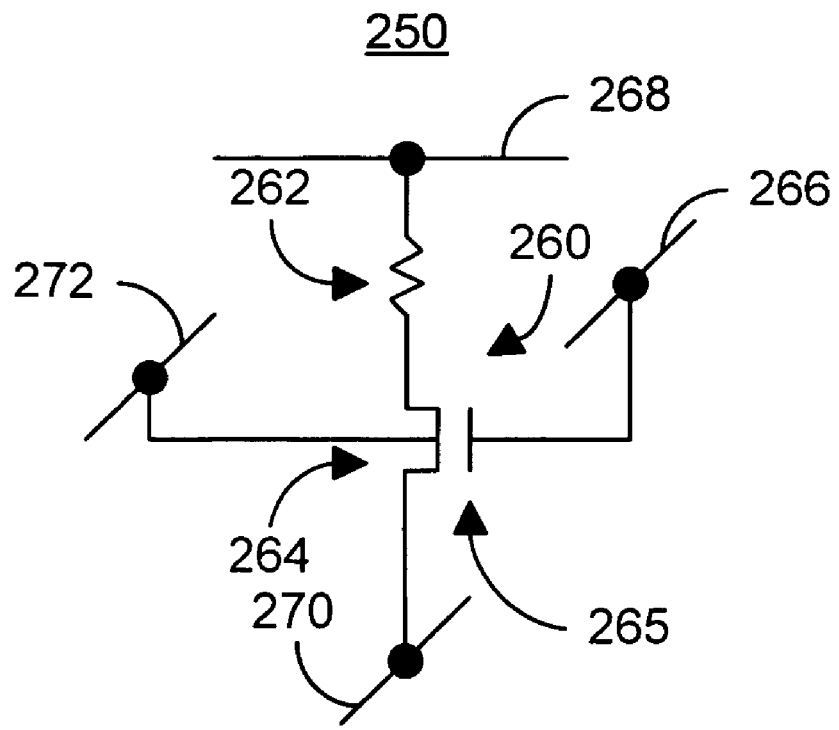
FIGS. 9A-9B is a diagram of another embodiment of a portion of a magnetic memory in accordance with the present invention utilizing spin transfer in switching and having a selection device that is body biased.
Figure 9B:
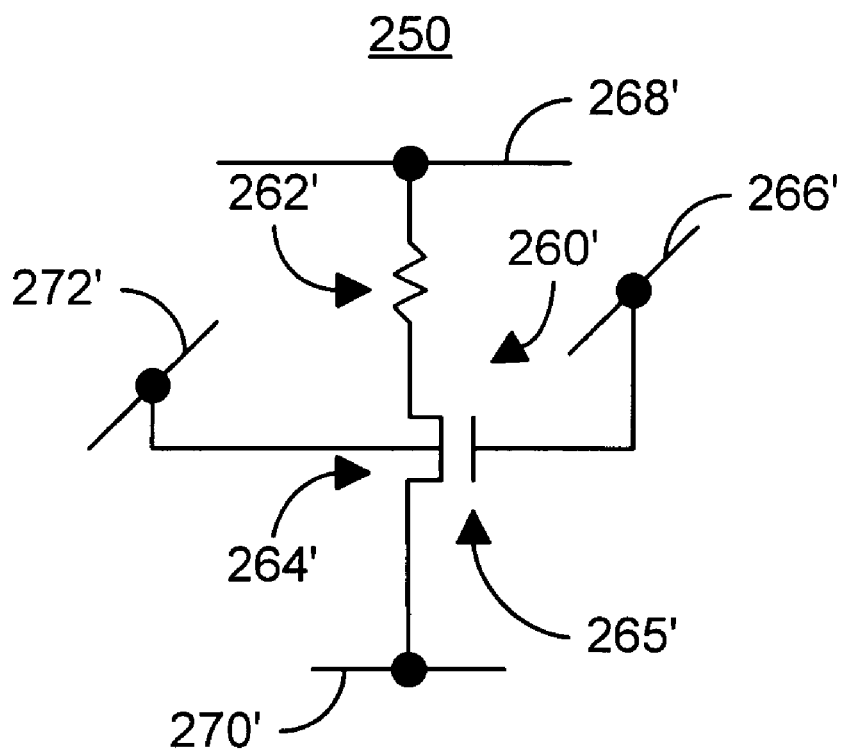

FIGS. 9A and 9B is a diagram of other embodiments of a portion of a magnetic memory 250 and 250', respectively, in accordance with the present invention utilizing spin transfer in switching and having a selection device that is body biased. The magnetic memories 250 and 250' are analogous to the magnetic memories 100 and 200. However, in the magnetic memories 250 and 250' use of an SOI selection transistor and voltage pumps are optional. The magnetic memories 250 and 250' utilized body biasing to reduce leakage current in a similar manner to that described above for the SOI transistor.

Referring to FIG. 9A, the magnetic memory 250 includes a magnetic memory cell 260 including a magnetic element 262 capable of being programmed using spin transfer and a selection device 264. The selection device 264 is preferably a CMOS transistor having a gate 265, as well as a source and a drain. The selection device 264 may optionally be a SOI transistor. The magnetic element 262 is read by driving a read current through the magnetic element 262. Thus, the magnetic element 262 may exhibit giant magnetoresistance. The magnetic memory 250 also includes lines 266, 268, 270, and 272. The lines 266, 268, and 270 are referred to herein as a word line 266, a bit line 268, and a source line 270, respectively. In the magnetic memory 250, the source line 270 is perpendicular to the bit line 268, but parallel to the word line 266. The magnetic memory 250 may optionally include a voltage pump (not shown) that is preferably coupled with the word line 266 and, therefore, the gate 265 of the selection transistor 264.

The magnetic element 262 is preferably programmed to a first state using a write current, $I_1$, passed in a first direction and programmed to a second state using a second write current, $I_2$, in a second direction. The magnetic memory 250 is preferably, therefore, a magnetic RAM. The magnetic element 262 might include a number of layers (not shown), but preferably includes at least a magnetic pinned layer (not shown), a nonmagnetic spacer layer (not shown), and a magnetic free layer (not shown) having a magnetization that can be changed using the write currents. The nonmagnetic spacer layer is preferably a tunneling barrier layer. However, in another embodiment, the nonmagnetic spacer layer might be another layer including but not limited to be a conductive or current-confined layer. In addition, in another embodiment, the magnetic element 262 may include different and/or additional components consistent with the present invention.

During off-state, a positive voltage is applied to the transistor body bias line 272. As a result, the effective transistor threshold voltage is increased. Consequently, leakage current for the transistor 264 may be reduced. Thus, when the storage cell 260 is not selected for writing, the leakage current due to the cell 260 is reduced. Consequently, other storage cell(s) (not shown) selected for writing are less adversely affected by the presence of the storage cell 260. During the on state, when the cell 260 is selected, the transistor body bias line 272 is set at ground voltage or another voltage to increase the transistor drain to source current. Consequently, the current through the magnetic element 262 may be increased for writing operation. Thus, a higher transistor writing current, a lower leakage current and, if an SOI transistor is used for the transistor 260, a smaller transistor size, can be used. Thus, the magnetic memory 250 may be more suitable for high density memory applications.

Referring to FIG. 9B, the magnetic memory 250' includes a magnetic memory cell 260' including a magnetic element 262' capable of being programmed using spin transfer and a selection device 264'. The selection device 264' is preferably a CMOS transistor having a gate 265', as well as a source and a drain. The selection device 264' may optionally be a SOI transistor. The magnetic element 262' is written to and read by driving a read current through the magnetic element 262'. Thus, the magnetic element 262' may exhibit giant magnetoresistance. The magnetic memory 250' also includes lines 266', 268', 270', and 272'. The lines 266', 268', and 270' are referred to herein as a word line 266', a bit line 268', and a source line 270', respectively. The magnetic memory 250' may optionally include a voltage pump (not shown) that is preferably coupled with the word line 266' and, therefore, the gate 265' of the selection transistor 264'.

The magnetic memory 250' is analogous to the magnetic memory 250. However, in the magnetic memory 250', the source line 270' is parallel to the bit line 268'. Although the configuration for the magnetic memory 250' is slightly different, the magnetic memory 250' shares the benefits of the magnetic memory 250.

Figure 10:
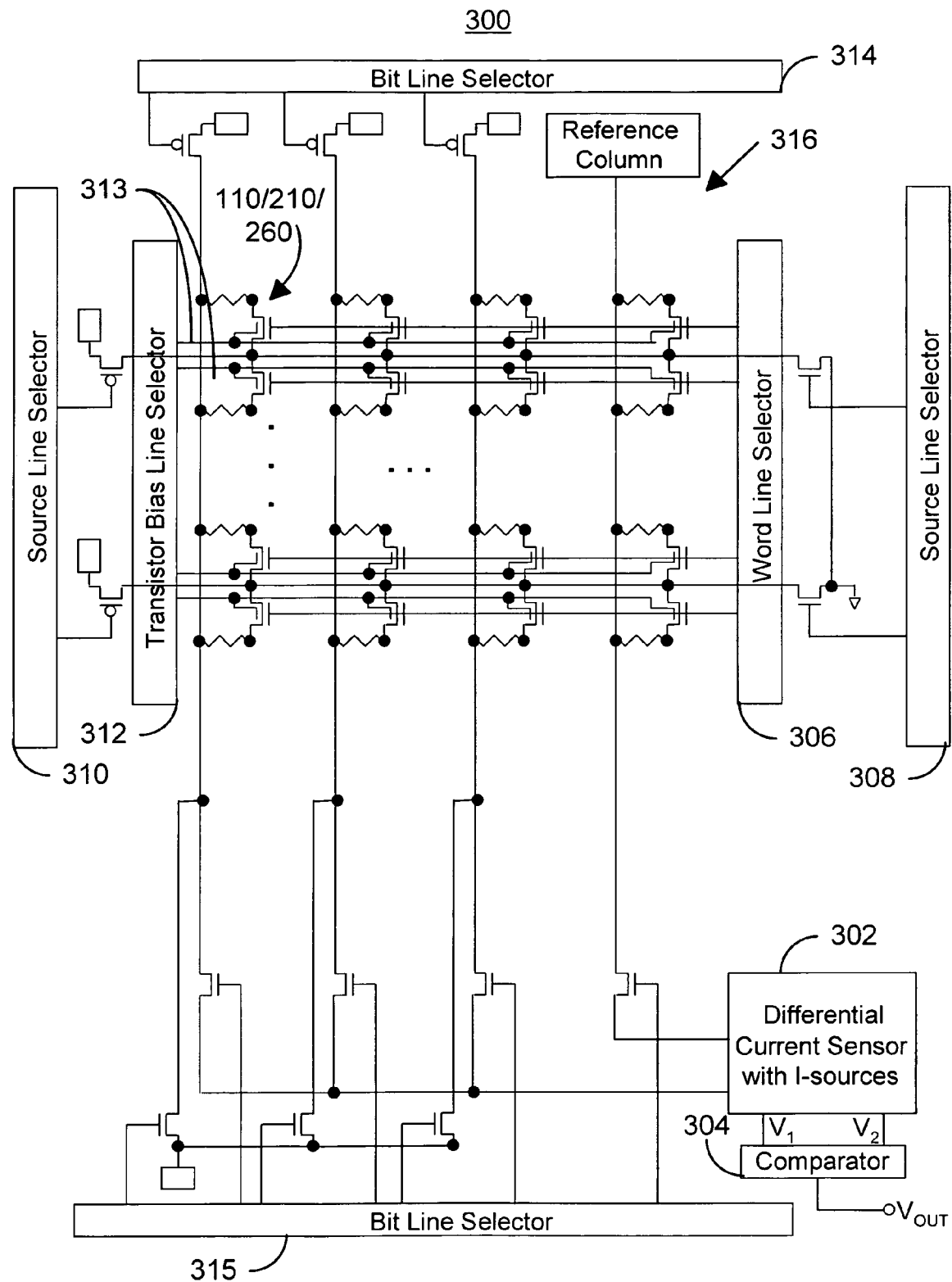
FIG. 10 is a diagram depicting one embodiment of a portion of circuitry for a magnetic memory in accordance with the present invention.

FIG. 10 is a diagram depicting one embodiment of a portion of circuitry for a magnetic memory 300 in accordance with the present invention. The magnetic memory 300 includes storage cells 110/210/260, differential current sensor with current sources 302 and comparator 304 used for reading data in the magnetic memory 300, word line selector 306, first source line selector 308, second source line selector 310, transistor bias line selector 312, bit line selectors 314 and 315, and a reference column 316. The transistor bias lines 313 are normally biased at the transistor off-state voltage, as described above. When the word line selector 306 selects a row, the transistor bias line selector 312 selects the same row of cells and transistors and switches the transistor bias line 313 to an on-state body bias voltage for high transistor current. Consequently, using the magnetic memory 300, the selection transistors (not explicitly labeled) for the cells 110/210/260 may be biased to reduce leakage current when off and increase the current through the magnetic element (not explicitly labeled) during writing. Furthermore, the magnetic memory 300 may include a voltage pump (not shown) or other mechanism to increase the bias voltage to the gates of the selection transistors beyond a supply voltage. As a result, the current through the magnetic elements can be further increased. Thus, the magnetic memory 300 may be more suited to high density applications.

Figure 11:
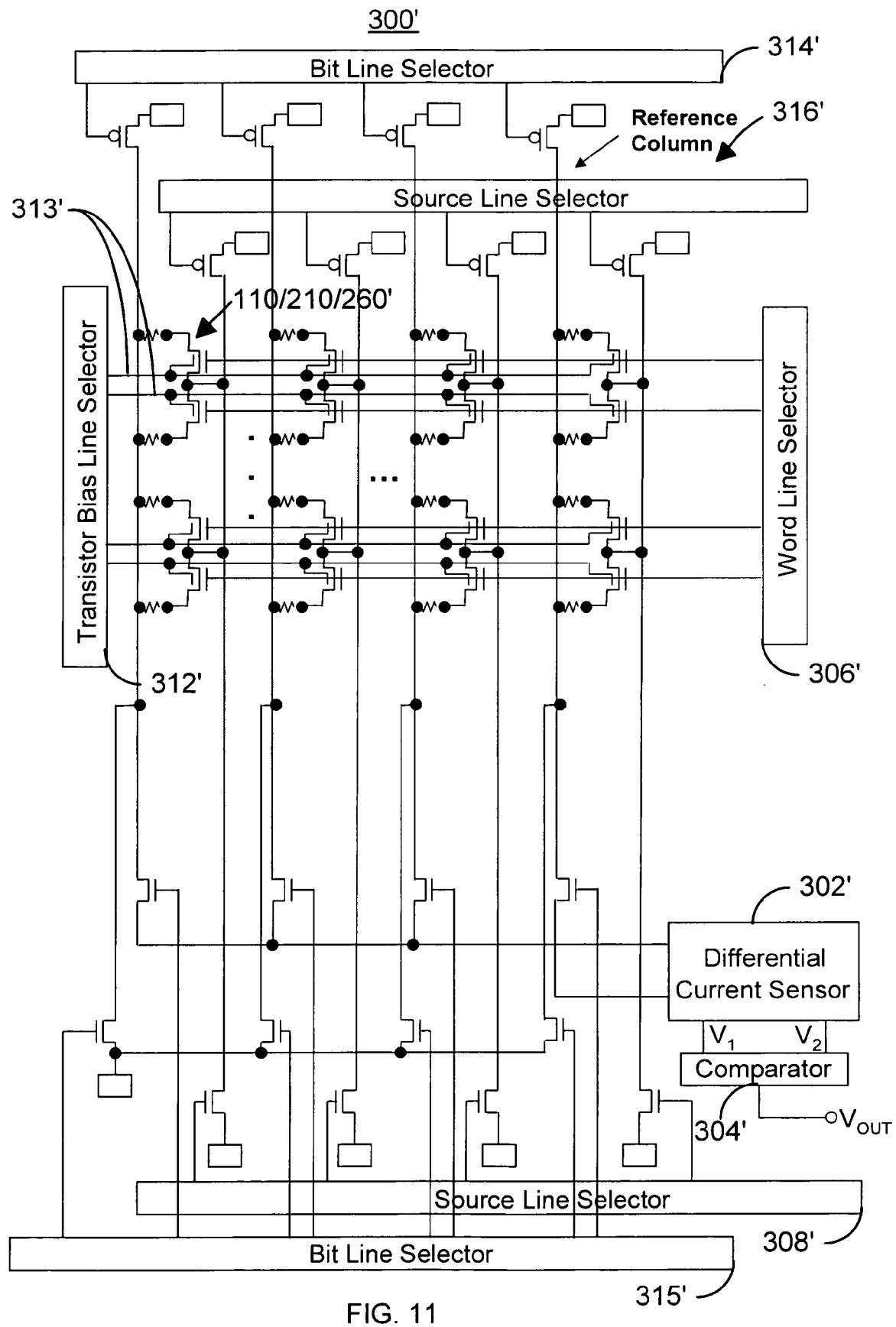
FIG. 11 is a diagram depicting one embodiment of a portion of circuitry for a magnetic memory in accordance with the present invention.

FIG. 11 is a diagram depicting one embodiment of a portion of circuitry for a magnetic memory 300' in accordance with the present invention. The magnetic memory 300' is analogous to the magnetic memory 300. Thus, the magnetic memory 300' includes storage cells 110/210/260', differential current sensor with current sources 302' and comparator 304' used for reading data in the magnetic memory 300', word line selector 306', source line selector 308', transistor bias line selector 312', bit line selectors 314' and 315', and a reference column 316'. However, the source lines 307 coupled with the source line selector 308' are parallel to the bit lines 317 coupled with the bit line selector 314'. The transistor bias lines 313' are normally biased at the transistor off-state voltage, as described above. When the word line selector 306' selects a row, the transistor bias line selector 312' selects the same row of cells and transistors and switches the transistor bias line 313' to an on-state body bias voltage for high transistor current. Consequently, using the magnetic memory 300', the selection transistors (not explicitly labeled) for the cells 110/210/260' may be biased to reduce leakage current when off and increase the current through the magnetic element (not explicitly labeled) during writing. Furthermore, the magnetic memory 300' may include a voltage pump (not shown) or other mechanism to increase the bias voltage to the gates of the selection transistors beyond a supply voltage. As a result, the current through the magnetic elements can be further increased. Thus, the magnetic memory 300' may be more suited to high density applications.

Figure 12:
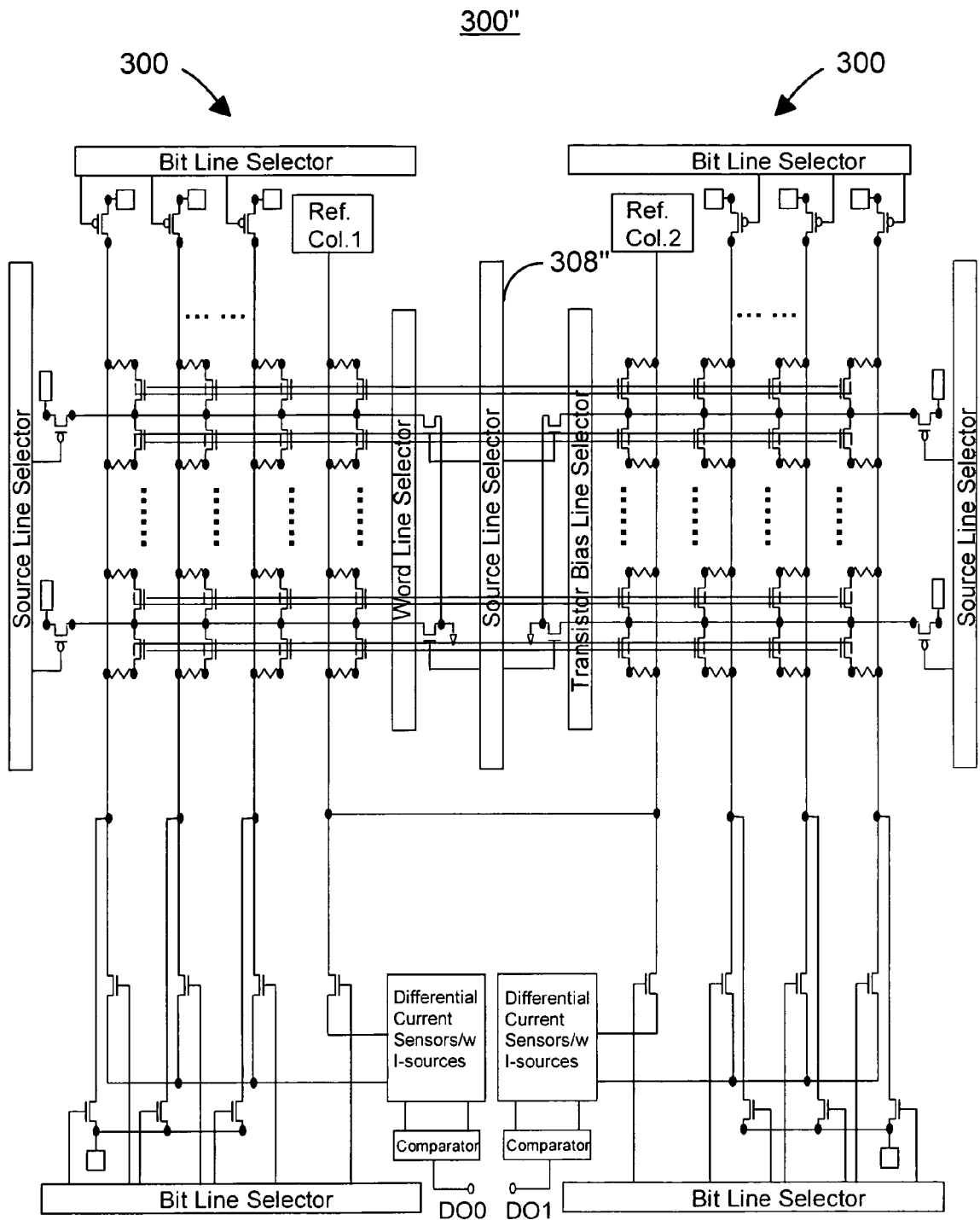
FIG. 12 is a diagram depicting one embodiment of a portion of circuitry for a magnetic memory in accordance with the present invention.

FIG. 12 is a diagram depicting one embodiment of a portion of circuitry for a magnetic memory 300" in accordance with the present invention. The magnetic memory 300" can be considered to be made up of two blocks analogous to the magnetic memory 300, but which share a source line selector 308". Consequently, the magnetic memory 300" shares the benefits of the magnetic memory 300. Thus, the magnetic memory 300" may be more suited to high density applications.

Thus, magnetic memories 100, 200, 300, and 300' and the storage cells 110, 110', 110", 110''', 250, and 250' may be written using a more localize phenomenon, at a higher write current, and/or with reduced leakage current due to non-selected storage cells. Consequently, performance of the magnetic memories magnetic memories 100, 200, 300, and 300' and the storage cells 110, 110', 110", 110'", 250, and 250' may be improved.

A method and system for providing and using a magnetic memory having an improved read and write margins has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

The invention claimed is:

1. A magnetic memory comprising:
   a plurality of magnetic storage cells, each of the plurality of magnetic storage cells including a magnetic element and a selection device coupled with the magnetic element, the magnetic element being programmed to a first state by a first write current driven through the magnetic element in a first direction and to a second state by a second write current driven through the magnetic element in a second direction;
   voltage supply for the magnetic memory, the voltage supply providing a supply voltage;
   a voltage pump coupled with the plurality of magnetic storage cells and the voltage supply, the voltage pump for providing a bias voltage to the selection device, the bias voltage having a magnitude greater than the supply voltage, the bias voltage allowing the selection device to support the first write current and the second write current, the first and second write current capable of programming the magnetic element; and
   control logic coupled with the plurality of magnetic storage cells, the control logic for ensuring that the bias voltage is provided to the selection device only when the first write current or the second write current is provided to the magnetic element.

2. The magnetic memory of claim 1 wherein the voltage pump includes at least one charge pump.

3. The magnetic memory of claim 2 wherein the at least one charge pump further includes at least one doubler.

4. The magnetic memory of claim 2 wherein the at least one charge pump further includes at least one inverter.

5. The magnetic memory of claim 2 further comprising:
   at least one voltage splitter coupled with the at least one charge pump and the plurality of magnetic storage cells, the voltage splitter for providing a plurality of voltages to the selection device, the plurality of voltages having a maximum magnitude greater than the supply voltage.

6. The magnetic memory of claim 2 wherein the selection device includes a transistor having a gate and wherein the bias voltage is provided to the gate.

7. The magnetic memory of claim 1 wherein the magnetic element is configured to be programmed using spin transfer.

8. The magnetic memory of claim 1 wherein the selection device is a selection transistor having a gate oxide, the gate oxide having a thickness of at least 0.8 nm.

9. The magnetic memory of claim 1 wherein the selection device is a selection transistor having a gate oxide, the gate oxide having a thickness of at least 1.2 nm.

10. The magnetic memory of claim 1 wherein the selection device is a selection transistor having a gate insulator having a dielectric constant of at least six.

11. A resistive memory comprising:
    at least one resistive storage cell, each of the at least one resistive storage cell including a resistive element and a selection device coupled with the resistive element, the resistive element being programmed by a write current driven through the resistive element, a resistance of the resistive element indicating a state of the resistive element and data stored in the resistive element;
    voltage supply for the resistive memory, the voltage supply providing a supply voltage;
    a voltage pump coupled with the plurality of resistive storage cells and the voltage supply, the voltage pump for providing a bias voltage, the bias voltage having a magnitude greater than the supply voltage, the bias voltage allowing the selection device to support the write current capable of programming the magnetic element;
    control logic coupled with the plurality of resistive storage cells, the control logic for ensuring that the bias voltage is provided to the selection device only when the write current is provided to the resistive storage element.

12. A method for utilizing a magnetic memory including a plurality of magnetic storage cells and a voltage supply, each of the plurality of magnetic storage cells including a magnetic element and a selection device coupled with the magnetic element, the magnetic element being programmed to a first state by a first write current driven through the magnetic element in a first direction and to a second state by a second write current driven through the magnetic element in a second direction, the voltage supply providing a supply voltage, the method comprising:
    driving the first current or the second current through the magnetic element in a portion of the plurality of magnetic storage cells; and
    providing a bias voltage to the selection device of the portion of the plurality of magnetic storage cells while the first current or the second current is driven through the magnetic element, the bias voltage having a magnitude greater than the supply voltage, the bias voltage allowing the selection device to support the first write current and the second write current, the first and second write current capable of programming the magnetic element, wherein the step of providing the bias voltage further includes
    utilizing control logic to ensure that the bias voltage is provided to the selection device only when the first write current or the second write current is provided to the magnetic element.

13. The method of claim 12 wherein the selection device includes a transistor having a gate and wherein the bias voltage providing further includes:
    providing the bias voltage to the gate.

14. The method of claim 12 wherein the magnetic element is configured to be programmed using spin transfer.

15. A method for utilizing a magnetic memory including a plurality of magnetic storage cells, each of the plurality of magnetic storage cells including a magnetic element and a selection device coupled with the magnetic element, the magnetic element being programmed to a first state by a first write current driven through the magnetic element in a first direction and to a second state by a second write current driven through the magnetic element in a second direction, the voltage supply providing a supply voltage, the method comprising:
    driving the first current or the second current through the magnetic element in a portion of the plurality of magnetic storage cells; and
    providing a bias voltage to the selection device of the portion of the plurality of magnetic storage cells while the first current or the second current is driven through the magnetic element, the bias voltage having a magnitude greater than 1.2 volts, the bias voltage allowing the selection device to support the first write current and the second write current, the first and second write current capable of programming the magnetic element; wherein the step of providing the bias voltage further includes:
utilizing control logic to ensure that the bias voltage is to the selection device only when the first write current or the second write current is provided to the magnetic element.

16. The method of claim 15 wherein the magnitude of the bias voltage is greater than 1.5 volts.

17. The method of claim 15 wherein the magnitude of the bias voltage is greater than 5 volts.

18. The method of claim 15 wherein the magnetic element is configured to be programmed using spin transfer.

* * * * *